US006362523B1

(12) United States Patent
Fukuda

(10) Patent No.: US 6,362,523 B1
(45) Date of Patent: Mar. 26, 2002

(54) SEMICONDUCTOR DEVICE

(75) Inventor: Kazuyoshi Fukuda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/475,657

(22) Filed: Dec. 30, 1999

(30) Foreign Application Priority Data

Aug. 23, 1999 (JP) .............................. 11-235115

(51) Int. Cl.$^7$ .............................................. H01L 23/34
(52) U.S. Cl. ........................................ 257/723; 257/528
(58) Field of Search ................................ 257/528, 723, 257/924

(56) References Cited

U.S. PATENT DOCUMENTS 5,982,018 A * 11/1999 Wark et al. ................. 257/924

FOREIGN PATENT DOCUMENTS

| JP | 730311 | 1/1995 |
| JP | 98482 | 1/1997 |

* cited by examiner

*Primary Examiner*—Roy Potter
(74) *Attorney, Agent, or Firm*—Leydig, Voit & Mayer, Ltd.

(57) ABSTRACT

In a semiconductor device, a semiconductor circuit is located on one surface (front surface) of a semiconductor chip and circuit elements, such as capacitors, resistors, or coils and pads connected to these circuit elements are located on the other surface (rear surface) of the semiconductor chip. The circuit elements are formed on the rear surface by chemical vapor deposition, sputtering, or electrolytic plating.

4 Claims, 3 Drawing Sheets

FRONT SURFACE

REAR SURFACE

SEMICONDUCTOR DEVICE

FIELD OF THE INVENTION

The present invention relates to a semiconductor device having a semiconductor chip. More particularly, this invention relates to a semiconductor device having a semiconductor circuit on one surface of a semiconductor chip.

BACKGROUND OF THE INVENTION

FIG. 5 is a perspective view showing a rough configuration of a conventional semiconductor device. FIGS. 6A and 6B are plan views showing rough configurations on the front surface and the rear surface of a semiconductor chip in the conventional semiconductor device. The conventional semiconductor device comprises a semiconductor chip 1, semiconductor circuits 2 on one surface (to be referred to as a front surface hereinafter) 3 of the semiconductor chip 1, and electrode terminals (to be referred to as pads hereinafter) 5 connected to the semiconductor circuits 2.

A metal film is entirely deposited on a semiconductor chip rear surface 4 opposing the semiconductor chip front surface 3 on which the semiconductor circuits 2 are formed to the affinity between a silicon substrate itself or the semiconductor chip 1 (in molding) and a not illustrated frame serving as a base.

However, according to the conventional technique, the semiconductor circuits 2 are formed on the semiconductor chip front surface 3, and the semiconductor chip rear surface 4 on which the semiconductor circuits 2 are not formed is a silicon substrate itself or is entirely covered with a metal film. Therefore, a problem that the semiconductor chip rear surface 4 is not effectively used at all is posed.

When a capacitor element or a coil element which requires a relatively large area is arranged on the semiconductor chip 1, since the area of the semiconductor chip 1 must be increased, costs disadvantageously increase. Since a capacitor element having a large capacitance or a coil element having a large reactance requires a larger area, these elements cannot be arranged on the semiconductor chip 1, and desired performance cannot be obtained, disadvantageously. Since a large number of parts which are not incorporated in the semiconductor device are present on a printed circuit board outside the semiconductor device, the printed circuit board cannot be reduced in size.

SUMMARY OF THE INVENTION

The present invention has been made in light of the problems described above. It is the first object of the present invention to obtain a semiconductor device which can effectively use the rear surface of the semiconductor chip on which a semiconductor circuit is not formed.

It is the second object of the present invention to obtain a semiconductor device which can reduce the area of a semiconductor chip to reduce costs, or a semiconductor device in which a capacitor element having a large capacitance and a coil element having a reactance can be arranged to achieve desired performance.

It is the third object of the present invention to obtain a semiconductor device which effectively uses the rear surface of the semiconductor chip on which the semiconductor circuit is not formed, incorporates parts on a printed circuit board outside the semiconductor device in the semiconductor device, and can reduce the printed circuit board in size.

According to a first aspect of the present invention, circuit elements such as capacitors, resistors, and coils and pads connected to these circuit elements are formed by chemical vapor deposition (CVD), sputtering, electrolyte plating, or the like on the rear surface of the semiconductor chip on which a semiconductor circuit is not formed.

Further, a coil element having a relatively large area is arranged on the rear surface of the semiconductor chip. In this manner, even a coil having a large reactance can be arranged.

Further, a capacitor element having a relatively large area can be arranged on the rear surface of the semiconductor chip. In this manner, even a capacitor having a relatively large capacitance can be arranged.

Further, a by-pass capacitor having a capacitance which is larger than that of a capacitor which can be arranged on the front surface of the semiconductor chip can be arranged on the rear surface.

According to a second aspect of the present invention, the metal wiring layer for connecting chip parts is formed on the rear surface of the semiconductor. Therefore, parts formed on a printed circuit board outside the semiconductor device can be incorporated in the semiconductor device.

Other objects and features of this invention will become apparent from the following description with reference to the accompanying drawings.

DESCRIPTION OF THE PREFERRED EMBODIMENTS

Embodiments of a semiconductor device according to the present invention will be described below in detail with reference to the accompanying drawings. The present invention is not limited to the embodiments described.

Figure 1A:
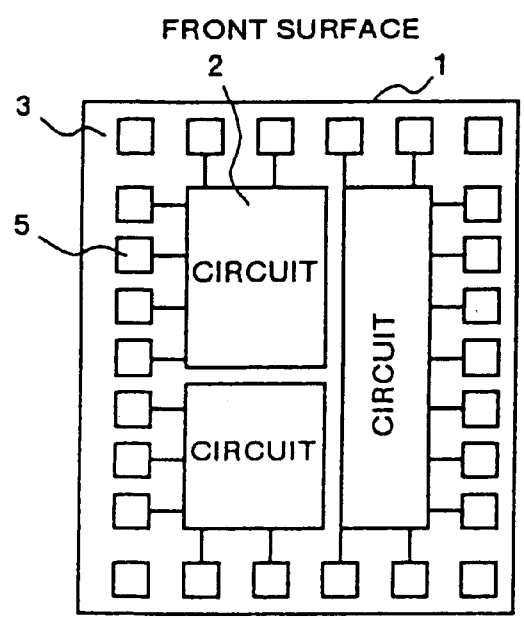
FIGS. 1A and 1B are plan views showing rough configurations on the front surface and the rear surface of a semiconductor chip in a semiconductor device according to a first embodiment of the present invention.
Figure 1B:
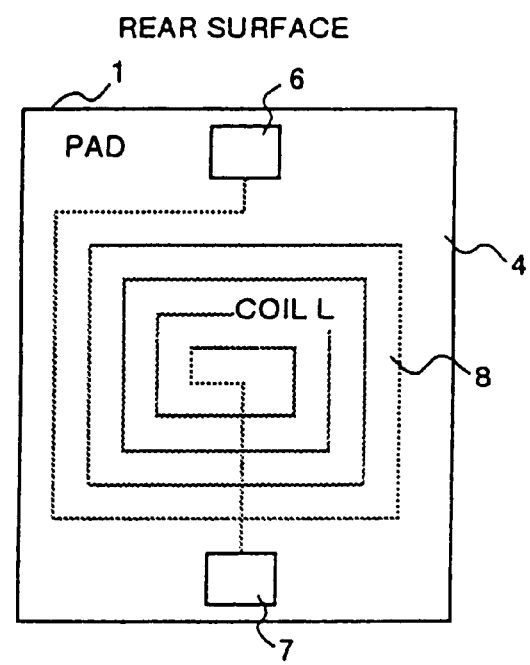
Figure 6A:
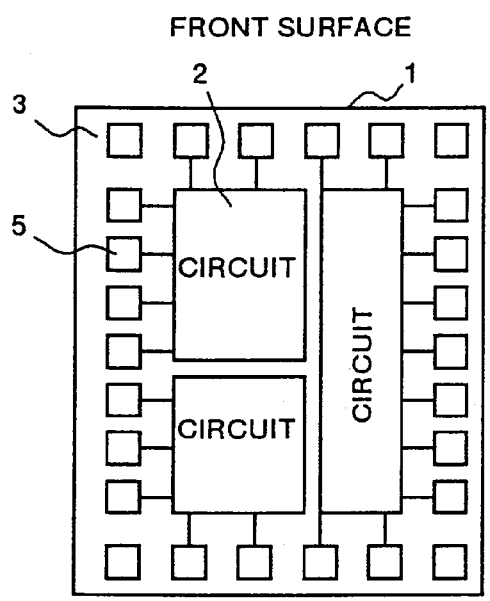
FIGS. 6A and 6B are plan views showing rough configurations on the front surface and the rear surface of a semiconductor chip in a conventional semiconductor device.
Figure 6B:
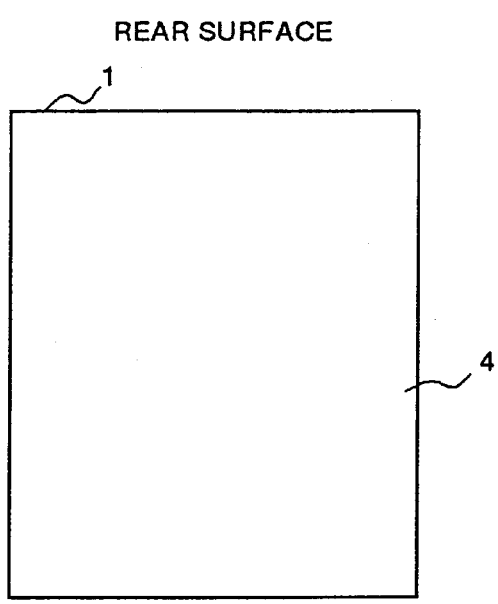

FIGS. 1A and 1B are plan views showing rough configurations of the front surface and the rear surface of a semiconductor chip in a semiconductor device (to be referred to as an IC hereinafter) according to a first embodiment of the present invention. The same reference numerals as in FIGS. 6A and 6B denote the same parts in FIGS. 1A and 1B, and a description thereof will be omitted. An IC according to the first embodiment comprises, on a semiconductor chip rear surface 4 on which a semiconductor circuit 2 is not formed, pads 6 and 7 and a coil element (reactance component) 8 connected to the pads 6 and 7 and constituted by a wiring layer consisting of a metal or the like.

More specifically, the coil element 8 requiring a relatively large area is not formed on the semiconductor chip front surface 3 but is formed on the semiconductor chip rear surface 4. In this manner, the coil element 8 having a reactance component which is too large to be located on the semiconductor chip front surface 3 can also be included.

Operation of the first embodiment will be described below. The IC according to the first embodiment performs a predetermined operation as in the case of a conventional IC which does not effectively use the semiconductor chip rear surface 4. In addition, the coil element 8 is increased in size to obtain a large reactance component, or a portion of the semiconductor chip front surface 3 occupied by the coil element 8 is used, so that another semiconductor function can be obtained.

As described above, in the IC according to the first embodiment, by using a metal wiring process, the pads 6 and 7 and the plane coil element 8 connected to the pads 6 and 7 are formed on the semiconductor chip rear surface 4 on which the semiconductor circuit 2 is not formed. In this manner, the coil element 8 which requires a relatively large area is formed on the semiconductor chip rear surface 4 which is not used in the prior art.

Therefore, since the coil element 8 which occupies a large area on the semiconductor chip front surface 3 in the prior art can be arranged on the semiconductor chip rear surface 4, the semiconductor chip rear surface 4 can be effectively used to reduce the area of the semiconductor chip 1 and the size of the IC.

By increasing the coil element 8 in size, the IC can obtain a reactance component larger than that of an IC having a chip area equal to that of the IC of the first embodiment. When another semiconductor function can be formed at a portion of the semiconductor chip front surface 3 occupied by the coil element 8, an additional value can be achieved in comparison with a conventional IC having a chip area equal to that of the IC of the first embodiment.

Figure 2A:
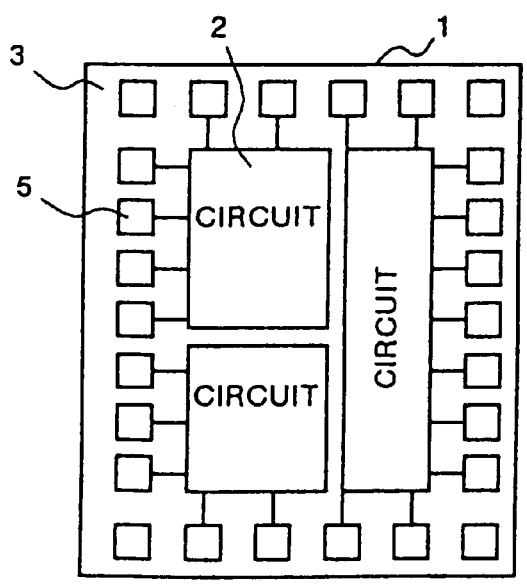
FIGS. 2A and 2B are plan views showing rough configurations on the front surface and the rear surface of a semiconductor chip in a semiconductor device according to a second embodiment of the present invention.
Figure 2B:
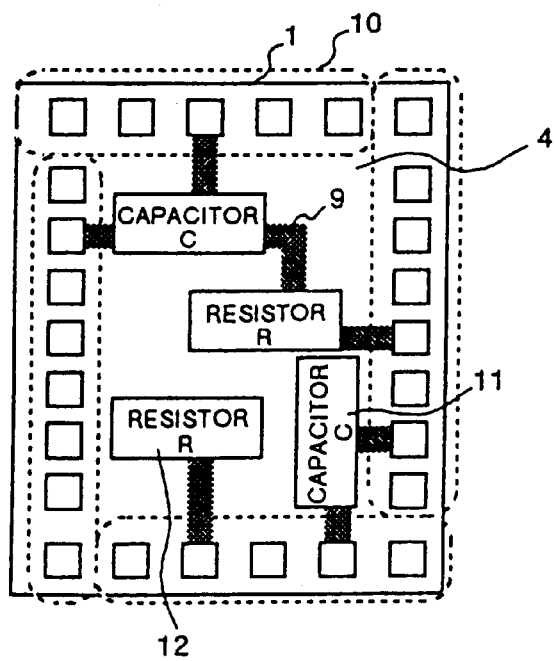

FIGS. 2A and 2B are plan views showing rough configurations on the front surface and the rear surface of a semiconductor chip 1 in a semiconductor device (IC) according to a second embodiment of the present invention. Since the basic configuration of the second embodiment is the same as the configuration of the first embodiment shown in FIGS. 1A and 1B, the same reference numerals as in FIGS. 1A and 1B denote the same parts in FIGS. 2A and 2B, and a description thereof will be omitted. Only different portions between the first embodiment and the second embodiment will be described below.

The IC according to the second embodiment comprises, on a semiconductor chip rear surface 4 on which a semiconductor circuit 2 is not formed, a chip capacitor 11, a chip resistor 12, a metal wiring pattern 9 for packaging the chip capacitor 11 and the chip resistor 12, and a pad group 10 connected to the metal wiring pattern 9. That is, an additional circuit constituted by a chip resistor, a chip capacitor, and the like arranged on a not illustrated printed circuit board for packaging an IC thereon in a prior art is arranged on a semiconductor chip rear surface 4.

In the configuration described above, an operation of second embodiment will be described below. The IC according to second embodiment performs a predetermined operation as in case of conventional IC which does not effectively use the semiconductor chip rear surface 4 and as in case of an additional circuit constituted by a chip resistor, a chip capacitor, and the like on a printed circuit board.

As described above, in the IC according to the second embodiment, by using a metal wiring process, a metal wiring layer like a printed circuit board is formed on the semiconductor chip rear surface 4 on which the semiconductor circuit 2 is not formed to make it possible to package the chip capacitor 11, the chip resistor 12, and the like, thereby forming an additional circuit.

Therefore, since an additional circuit which is arranged on a printed circuit board can be incorporated in the semiconductor chip rear surface 4 which is not used in a prior art, the semiconductor chip rear surface 4 can be effectively used. The number of parts on the printed circuit board can be reduced, and the printed circuit board can be reduced in size.

Figure 3A:
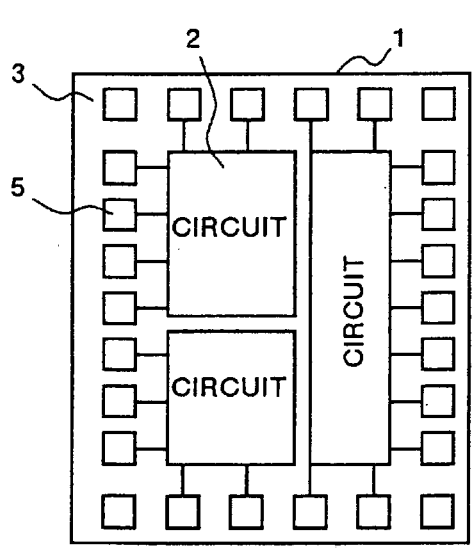
FIGS. 3A and 3B are plan views showing rough configurations on the front surface and the rear surface of a semiconductor chip in a semiconductor device according to a third embodiment of the present invention.
Figure 3B:
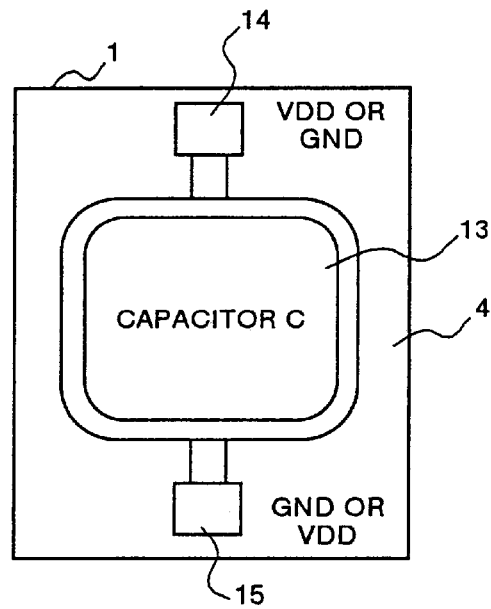

FIGS. 3A and 3B are plan views showing rough configurations on the front surface and the rear surface of a semiconductor chip 1 in a semiconductor device (IC) according to a third embodiment of the present invention. Since the basic configuration of the third embodiment is the same as the configuration of the first embodiment shown in FIGS. 1A and 1B, the same reference numerals as in FIGS. 1A and 1B denote the same parts in FIGS. 3A and 3B, and a description thereof will be omitted. Only different portions between the first embodiment and the third embodiment will be described below.

The IC according to the third embodiment comprises, on a semiconductor chip rear surface 4 on which a semiconductor circuit 2 is not formed, pads 14 and 15 and a capacitor element 13 connected to the pads 14 and 15. The capacitor element 13 is formed by a thermal oxidation process and a metal wiring process to have a large capacitance.

The pads 14 and 15 are connected to a power supply (VDD) wiring layer and a ground (GND) wiring layer of a semiconductor chip front surface 3 respectively, and the capacitor element 13 functions as a by-pass capacitor (to be referred to as a pass capacitor hereinafter). That is, the capacitor element 13 requiring a relatively large area can be arranged on the semiconductor chip rear surface 4 but not on the semiconductor chip front surface 3.

Therefore, the pass capacitor having a capacitance which is too large to be arranged on the semiconductor chip front surface 3 can be arranged. In addition, the area of the semiconductor chip 1 and the size of the IC can be reduced.

In the configuration described above, an operation of the third embodiment will be described below. The IC according to the third embodiment performs a predetermined operation as in case of conventional IC which does not effectively use the semiconductor chip rear surface 4. By arranging a pass capacitor having a large capacitance, the power supply voltage of the IC can be stabled, and power supply noise can be reduced.

In particular, when the semiconductor circuit 2 is an analog circuit, by adding a pass capacitor to a power supply, power supply noise can be suppressed, and analog circuit characteristics can be improved. When the capacitance of the capacitor added to the power supply is increased, the influence of electrostatic breakdown caused by an overcurrent applied to the power supply can be decreased.

As described above, in the IC according to the third embodiment, the large-capacitance capacitor element 13 serving as a pass capacitor is formed by a thermal oxidation process and a metal wiring process on the semiconductor chip rear surface 4 on which the semiconductor circuit 2 is not formed. In this manner, since the capacitor element 13 requiring a large area can be arranged on the semiconductor chip rear surface 4, the area of the semiconductor chip 1 and the size of the IC can be reduced by effectively using the semiconductor chip rear surface 4.

Since the pass capacitor can be added, the power supply voltage of the IC can be stabled, and power supply noise can be reduced. Especially, in an analog circuit, analog circuit characteristics can be improved by suppressing power supply noise. In addition, the influence of electrostatic breakdown caused by an over-current applied to the power supply can be decreased.

Figure 4A:
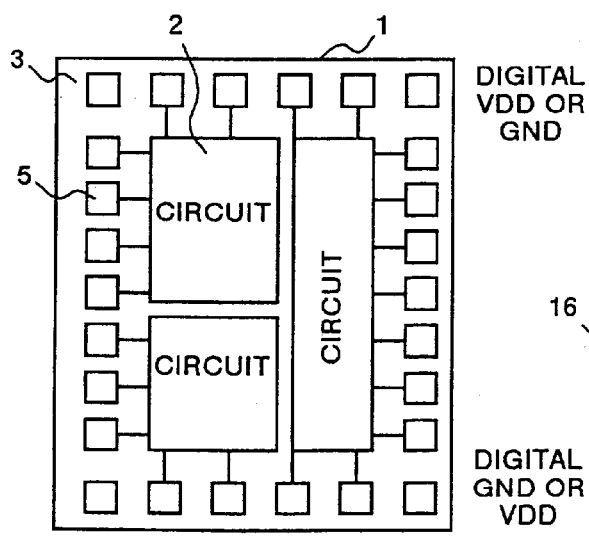
FIGS. 4A and 4B are plan views showing rough configurations on the front surface and the rear surface of a semiconductor chip in a semiconductor device according to a fourth embodiment of the present invention.
Figure 4B:
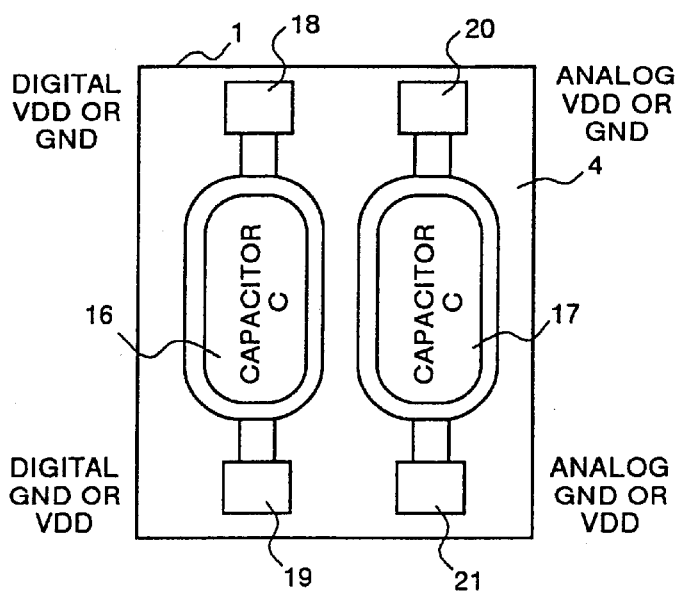
Figure 5:
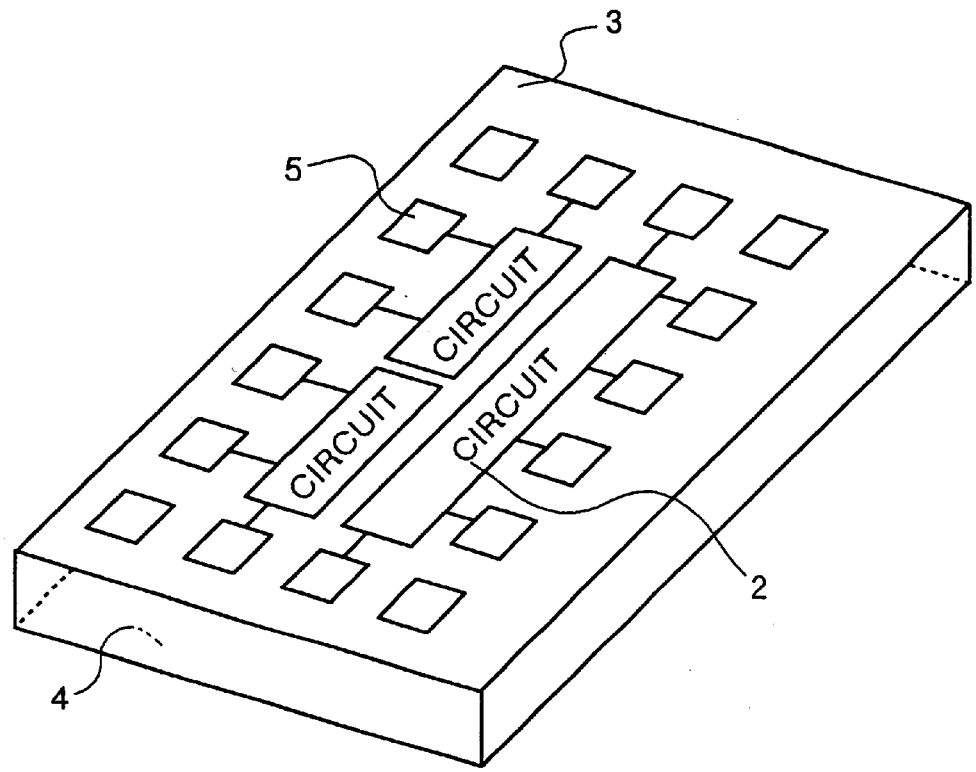
FIG. 5 is a perspective view showing a rough configuration of a conventional semiconductor device.

FIGS. 4A and 4B are plan views showing rough configurations on the front surface and the rear surface of a semiconductor chip 1 in a semiconductor device (IC) according to a fourth embodiment of the present invention. Since the basic configuration of the fourth embodiment is the same as the configuration of the first embodiment shown in FIGS. 1A and 1B, the same reference numerals as in FIGS. 1A and 1B denote the same parts in FIGS. 4A and 4B, and a description thereof will be omitted. Only different portions between the first embodiment and the fourth embodiment will be described below.

The IC according to the fourth embodiment comprises, on a semiconductor chip rear surface 4 on which a semiconductor circuit 2 is not formed, pads 18, 19, 20, and 21, a digital capacitor element 16 connected to the pads 18 and 19, and an analog capacitor element 17 connected to the pads 20 and 21.

The digital capacitor element 16 and the analog capacitor element 17 are constituted by a dielectric and a metal wiring layer and have large capacitances. The semiconductor circuit 2 has a digital circuit, an analog circuit, a VDD wiring layer and a GND wiring layer which are for the digital circuit, and a VDD wiring layer and a GND wiring layer which are for the analog circuit.

The pads 18 and 19 are connected to the VDD wiring layer and the GND wiring layer which are for the digital circuit on a semiconductor chip front surface 3, respectively, and the digital capacitor element 16 serves as a pass capacitor dedicated to the digital circuit. The pads 20 and 21 are connected to the VDD wiring layer and the GND wiring layer which are for the analog circuit on a semiconductor chip front surface 3, respectively, and the analog capacitor element 17 serves as a pass capacitor dedicated to the analog circuit.

That is, the capacitor elements 16 and 17 requiring relatively large areas can be arranged on the semiconductor chip rear surface 4 but not on the semiconductor chip front surface 3. In this manner, even in an IC in which a digital circuit and an analog circuit are packaged, a pass capacitor having a capacitance which is too large to be arranged on the semiconductor chip front surface 3 can be arranged. In addition, the area of the semiconductor chip 1 and the size of the IC can be reduced.

In the configuration described above, an operation of the fourth embodiment will be described below. The IC according to the fourth embodiment performs a predetermined operation as in case of conventional IC which does not effectively use the semiconductor chip rear surface 4. By arranging a pass capacitor having a large capacitance, the power supply voltage of the IC can be stabled, and power supply noise can be reduced. By arranging pass capacitors dedicated to an analog circuit and a digital circuit, noise of the digital circuit is suppressed from be circulated to the analog circuit through a pass capacitor.

As described above, in the IC according to the fourth embodiment, the large-capacitance capacitor elements 16 and 17 serving as pass capacitors are formed by a thermal oxidation process and a metal wiring process on the semiconductor chip rear surface 4 on which the semiconductor circuit 2 is not formed. In this manner, since the capacitor elements 16 and 17 requiring large areas can be arranged on the semiconductor chip rear surface 4, the area of the semiconductor chip 1 and the size of the IC can be reduced by effectively using the semiconductor chip rear surface 4.

Further, by forming a plurality of capacitors on the semiconductor chip rear surface 4, even if the semiconductor circuit 2 on which a digital circuit and an analog circuit are packaged is formed on the semiconductor chip front surface 3, pass capacitors dedicated to the digital and the analog circuit are arranged between the VDD circuit and the GND circuit for the digital and analog circuits. For this reason, in particular, large-capacitance pass capacitors can be added to the digital circuit and the analog circuit without circulating noise of the digital circuit to the analog circuit through a pass capacitor. Therefore, the power supply voltage of the IC can be stabled.

As has been described above, according to the first aspect of the present invention, circuit elements such as a capacitor, a resistor, and a coil and pads connected to these circuit elements are formed by a vapor-phase growing method (CVD: Chemical Vapor Deposition), a sputtering method, an electrolyte plating method, or the like on a semiconductor chip rear surface on which a semiconductor circuit is not formed. For this reason, the semiconductor chip rear surface on which the semiconductor circuit is not formed can be effectively used, advantageously.

Further, since a coil element having a relatively large area is arranged on the semiconductor rear surface, the area of the semiconductor chip is reduced, so that costs can be reduced. In addition, since even a coil element having a large reactance can be arranged, desired performance can be advantageously obtained.

Further, since a capacitor element having a relatively large area is arranged on the semiconductor chip rear surface, the area of the semiconductor chip is reduced, so that costs can be reduced. In addition, since even a capacitor element having a large capacitance can be arranged, desired performance can be advantageously obtained.

Further, since a by-pass capacitor having a capacitance larger than that of a capacitor element which can be arranged on the semiconductor chip front surface, noise of the semiconductor device can be disadvantageously reduced.

According to the second aspect of the present invention, a metal wiring layer for connecting chip parts is formed on the semiconductor rear surface, and parts on a printed circuit board outside the semiconductor device can be incorporated in the semiconductor chip rear surface. For this reason, the number of parts on the printed circuit board outside the semiconductor device is reduced, and the printed circuit board can be advantageously reduced in size.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising a semiconductor chip having a first surface on which a semiconductor circuit is located, and at least one circuit element located on a second surface of the semiconductor chip different from the first surface, wherein said circuit element includes an oxide produced by thermal oxidation of the second surface of said semiconductor chip and a metal disposed on said oxide.

2. The semiconductor device according to claim 1, wherein said circuit element is a capacitor.

3. A semiconductor device comprising a semiconductor chip having a first surface on which a semiconductor circuit is located, and a bypass capacitor located on a second surface of the semiconductor chip, different from the first surface, the by-pass capacitor having a capacitance larger than a capacitance of a capacitor that can be arranged on the first surface of the semiconductor chip.

4. The semiconductor device according to claim 1, wherein said circuit element is a coil.

* * * * *